US007286676B2

(12) United States Patent
Kato et al.

(10) Patent No.: US 7,286,676 B2
(45) Date of Patent: Oct. 23, 2007

(54) AUDIO APPARATUS

(75) Inventors: Shinjiro Kato, Saitama (JP); Takami Maeda, Saitama (JP); Kazuhito Tatsuta, Saitama (JP)

(73) Assignee: Pioneer Corporation, Tokyo (JP)

( * ) Notice: Subject to any disclaimer, the term of this patent is extended or adjusted under 35 U.S.C. 154(b) by 468 days.

(21) Appl. No.: 10/154,779

(22) Filed: May 28, 2002

(65) Prior Publication Data

US 2002/0181713 A1 Dec. 5, 2002

(30) Foreign Application Priority Data

May 29, 2001 (JP) ........................ P 2001-160195

(51) Int. Cl.
*H03G 3/00* (2006.01)
*H04R 5/00* (2006.01)

(52) U.S. Cl. ........................ 381/109; 381/107; 381/58; 381/27

(58) Field of Classification Search .................. 381/98, 381/103, 56, 58, 86, 104–109, 59, 27
See application file for complete search history.

(56) References Cited

U.S. PATENT DOCUMENTS 4,405,836 A * 9/1983 Meyerhoff .................. 381/103
5,530,760 A 6/1996 Paisley
5,745,583 A * 4/1998 Koizumi et al. .............. 381/86
6,005,949 A * 12/1999 Shimizu et al. ............... 381/61
6,697,687 B1 * 2/2004 Kasahara et al. ............. 700/94
6,867,820 B2 * 3/2005 Jin ............................ 381/306

FOREIGN PATENT DOCUMENTS

| | | |
|---|---|---|
| EP | 0 352 627 A | 1/1990 |
| EP | 0 479 456 A2 | 4/1992 |
| EP | 0 528 475 A1 | 2/1993 |
| JP | 2001-45600 A | 2/2001 |

* cited by examiner

*Primary Examiner*—Brian Pendleton
(74) *Attorney, Agent, or Firm*—Sughrue Mion, PLLC

(57) ABSTRACT

In an audio apparatus 10 to which plural kinds of audio signals of different numbers of channels are input, a sound field control section 3 which performs a sound field control on the audio signals on the basis of a sound field control data is provided, and the sound field control data is stored in a memory 6 for each of the kinds of audio signals.

4 Claims, 4 Drawing Sheets

FIG. 4
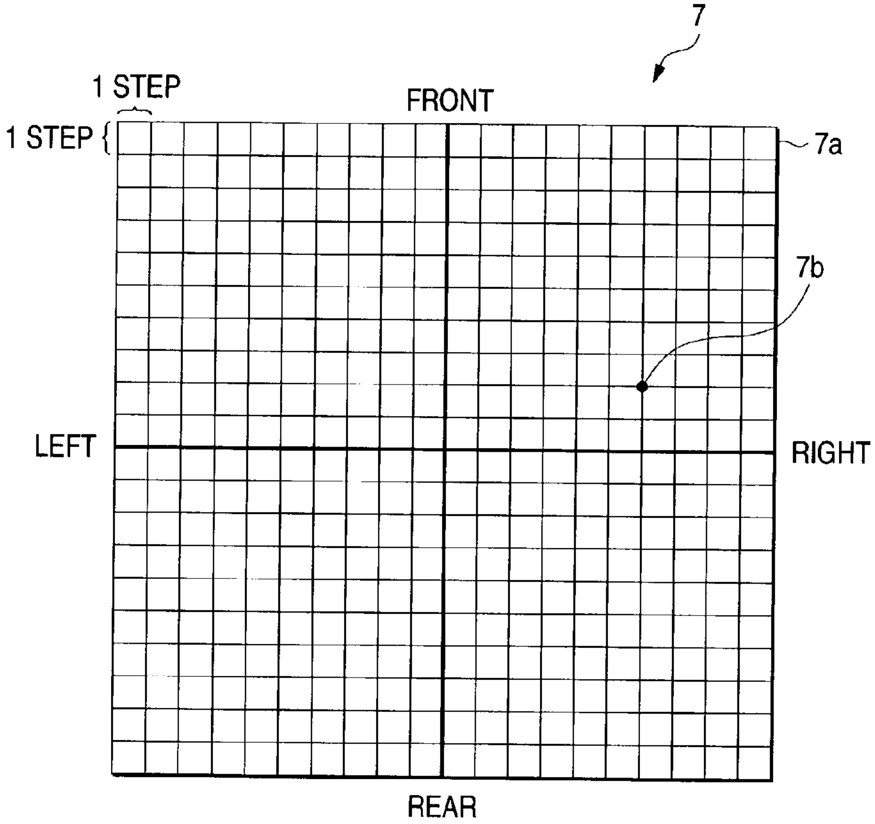
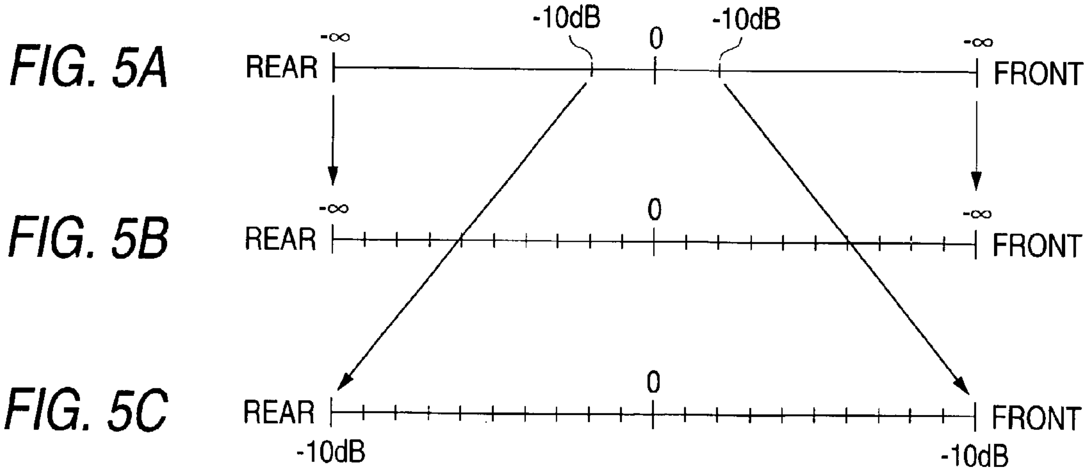

AUDIO APPARATUS

BACKGROUND OF THE INVENTION

The present invention relates to an audio apparatus in which, when sources of different numbers of channels are to be reproduced, balance/fader adjustment is easily performed.

In order to output in two channels a 2-channel compatible audio source supplied from a CD, an MD, or the like (hereinafter, such an audio source is referred to as a 2-channel source), speakers for two channels, i.e., two speakers respectively for left and right sides are required.

In a vehicle audio apparatus, such speakers for two channels are placed in the front and rear sides of a cabin, and a 2-channel source is output in two channel from both the front and rear sides. The audio apparatus includes: a fader adjustment section which adjusts the volume balance of the 2-channel source output from front and rear speakers; and a balance adjustment section which adjusts the volume balance of the 2-channel source output from left and right speakers. The listener can set the 2-channel source output from the speakers so as to produce a sound field (localization) suiting own taste, by using the two adjustment sections.

Specifically, the balance adjustment section can set sound localization of the 2-channel source to the driver's side or to the passenger's side or move sound localization in the lateral direction, by adjusting the volume balance of the 2-channel source output from the left and right speakers. The fader adjustment section can set sound localization of the 2-channel source to the front side of the cabin or to the rear side or move sound localization in the anteroposterior direction, by adjusting the volume balance of the 2-channel source output from the front and rear speakers.

In accordance with the advance of the capacity of a recording medium, audio apparatuses which can output a multi-channel audio source of three or more channels (hereinafter, such an audio source is referred to as a multi-channel source) in addition to a 2-channel source are increasing in number.

In a DVD, for example, a 5.1-channel audio source is recorded in order to listen to the audio of a more enhanced sense of presence. Specifically, audio sources for six channels consisting of front left and right speakers, rear left and right speakers, a center speaker, and a woofer are independently recorded. In a vehicle audio apparatus, therefore, a center speaker and a woofer are additionally disposed in a cabin so as to cope with a multi-channel source, with the result that the apparatus has a configuration which can cope with both a 2-channel source and a multi-channel source.

However, a premise for a process of producing source contents in a 2-channel source for a stereophonic system is different from that in a multi-channel source for the 5.1-channel system or the like. Depending on whether the audio source to be listened is a 2-channel source or a 5.1-channel source, therefore, the setting conditions of the balance and the fader must be changed each time. In other words, with respect to a 2-channel source, the optimum setting is not requested by the source contents, and the balance and the fader are set basically in accordance with the taste of the listener. By contrast, a multi-channel source is produced on the premise that the reproduction volumes of the channels are equal to one another at the listening position, and hence the balance and the fader must be set so that sound localization is placed at the listening position.

In a 2-channel source, for example, the fader may be often adjusted with being extremely shifted toward the front or rear side because the balance and the fader are adjusted in accordance with the taste of the listener. When a multi-channel source is reproduced while maintaining such fader adjustment, reproduction is performed with extremely shifting sound localization to the front or rear side with respect to the listening position, with the result that the sense of presence of the reproduced audio is largely impaired.

SUMMARY OF THE INVENTION

The invention is conducted in view of the problem. It is an object of the invention to provide an audio apparatus in which optimum sound field setting is enabled in both the cases where a 2-channel source is reproduced, and where a multi-channel source is reproduced.

In order to solve the problem, an audio apparatus according to a first aspect of the invention is an apparatus to which plural kinds of audio signals of different numbers of channels are input, and wherein the apparatus includes: an input section to which an adjustment value for controlling a sound field is input; a sound field control section which performs a sound field control on the audio signals on the basis of the adjustment value; a storage section which stores the adjustment value; a detection section which detects the kinds of the audio signals; and a control section which, on the basis of a result of the detection, causes the adjustment value to be stored in the storage section for each of the kinds of audio signals.

An audio apparatus according to a second aspect of the invention is characterized in that, in the audio apparatus according to the first aspect of the invention, the sound field control section includes at least one of a balance adjustment section which adjusts a balance of the audio signals, and a fader adjustment section which adjusts a fader of the audio signals, and, in accordance with the result of the detection by the detection section, the control section changes an input range of the adjustment value in the input section and relating to at least one of the balance adjustment section and the fader adjustment section.

BRIEF DESCRIPTION OF THE DRAWINGS

FIG. 1 is a diagram showing main portions of an audio apparatus 10 of an embodiment.

FIG. 2 is a diagram showing the arrangement of speakers in a cabin.

FIG. 3 is a view showing the configuration of a balance/fader adjusting button.

[FIG. 4] FIG. 4 is a view showing a display screen in the case of balance/fader adjustment.

[FIG. 5] FIGS. 5A to 5C are principle diagrams illustrating a fader adjustable range of a fader adjustment section.

FIG. 6 is an operation flow diagram of a sound field control of an audio apparatus 10.

DETAILED DESCRIPTION OF THE PREFERRED EMBODIMENTS

An audio apparatus 10 of an embodiment of the invention will be described with reference to the accompanying drawings. The invention will be described by means of an embodiment in which the invention is applied to the vehicle audio apparatus 10 that, in order to allow a multi-channel source for the 5.1-channel system or the like to be reproduced, comprises a center speaker FC placed in the center of a front side, and a woofer SW for bass enhancement in addition to front left and right speakers FL and FR and rear left and right speakers RL and RR.

Figure 1:
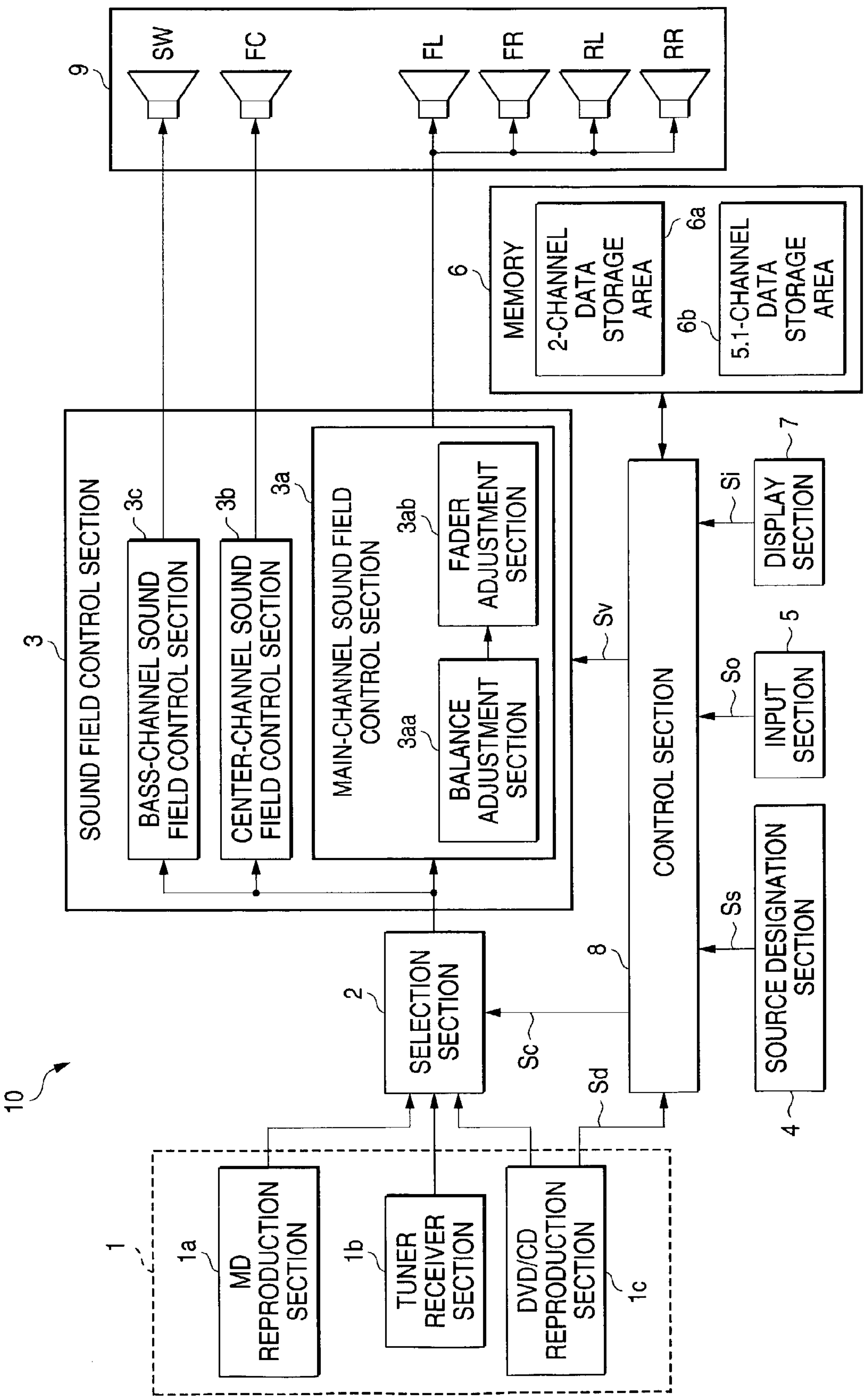
[FIG. 1]

First, the configuration and schematic operation of the audio apparatus 10 of the embodiment will be described with reference to FIGS. 1 to 4. FIG. 1 is a diagram showing in principle the configuration of main portions of the audio apparatus 10 and the signal flow in the apparatus, FIG. 2 is a diagram showing the arrangement of speakers in a cabin, FIG. 3 is a view showing the configuration of a balance/fader adjusting button, and FIG. 4 is a view showing a display screen of a display section 7 in the case of balance/fader adjustment.

As shown in FIG. 1, the audio apparatus 10 of the embodiment includes: a reproduction section 1 having a plurality of audio sources; a selection section 2 which selects one of the audio sources of the reproduction section 1; a sound field control section 3 which controls the sound field of an audio signal of the audio source that is selected by the selection section 2; a speaker group 9 which outputs the sound field-controlled audio signal; a source designation section 4 which designates a source that is to be selected by the selection section 2; an input section 5 to which an adjustment value for controlling the sound field in the sound field control section 3 is input by the listener; a memory 6 which stores sound field control data for performing a sound field control by the sound field control section 3; the display section 7 which displays various kinds of information; and a control section 8 which controls the whole apparatus.

The reproduction section 1 has a plurality of audio sources such as an MD reproduction section 1*a*, a tuner receiver section 1*b*, and a DVD/CD reproduction section 1*c*. Audio signal outputs from the audio sources are supplied to the selection section 2. The selection section 2 selects an audio signal corresponding to the audio source which is designated by a selection signal Sc supplied from the control section 8, and supplies the selected audio signal to the sound field control section 3 in the subsequent stage. The sound field control section 3 includes: a main-channel sound field control section 3*a* which controls the sound field of the audio signals output from the front left, front right, rear left, and rear right speakers; a center-channel sound field control section 3*b* which controls the sound field of the audio signal output from the center speaker FC; and a bass-channel sound field control section 3*c* which controls the sound field of the audio signal output from the woofer SW, and performs a sound field control on the audio signals on the basis of a sound field control data Sv supplied from the control section 8. The main-channel sound field control section 3*a* has a balance adjustment section 3*aa* and a fader adjustment section 3*ab* each of which is configured by an electronic volume controller.

Figure 2:
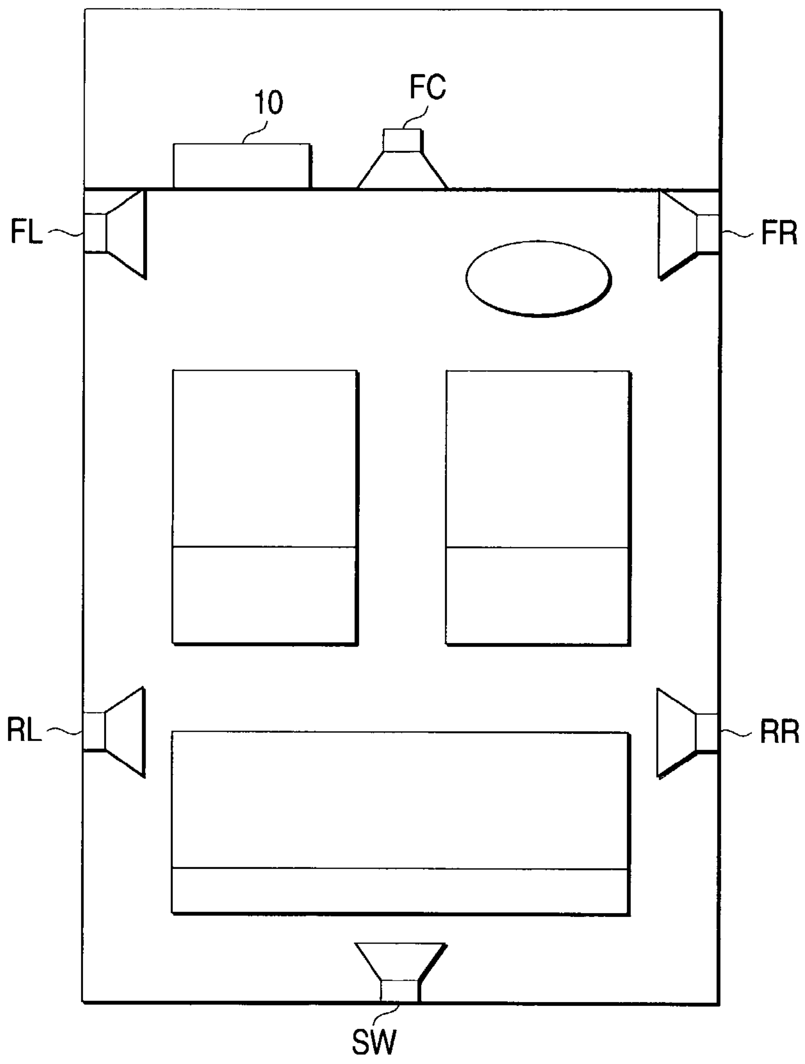
[FIG. 2]
Figure 3:
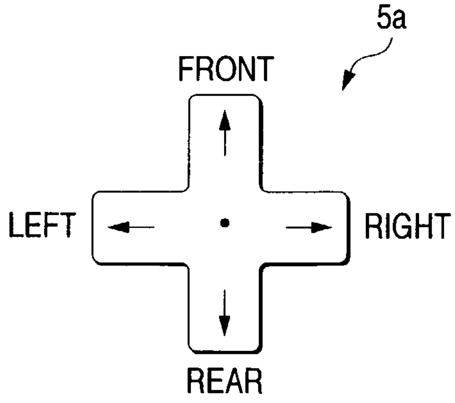
[FIG. 3]

As shown in FIG. 2, the speaker group 9 is configured by the front left and right speakers FL and FR, the rear left and right speakers RL and RR, the front center speaker FC, and the woofer SW. In accordance with the number of channels of the selected audio signal, the audio signal is supplied to the speakers. Specifically, in the speaker group 9, when a 2-channel source is selected, an audio signal is supplied to the left and right speakers of the front and rear sides, and, when a 5.1-channel source is selected, an audio signal is supplied to the center speaker FC and the woofer SW in addition to the left and right speakers of the front and rear sides.

The source designation section 4 is means for designating a desired audio source by the listener, and supplies information relating to the audio source designated by the listener, as a designation signal Ss to the control section 8. In response to the designation signal Ss, the control section 8 produces the selection signal Sc on the basis of the designation signal Ss, to instruct the selection section 2 to switch over the audio source. The input section 5 is means for inputting an adjustment value for performing a sound field control on the audio signal designated by the source designation section 4, and has at least a balance/fader adjusting button 5*a* which is formed into a cross shape shown in FIG. 3, and an input button (not shown) for adjusting the volume of the woofer SW. When one of the buttons is operated by the listener, the input section 5 supplies to the control section 8 an adjustment data So according to the degree of the operation imposed on the button. On the basis of the received adjustment data So, the control section 8 produces the sound field control data Sv to instruct the sound field control section 3 to perform a sound field control on the audio source. The memory 6 has: a 2-channel data storage area 6*a* in which the sound field control data of the sound field control section 3 with respect to a 2-channel source is stored; and a 5.1-channel data storage area 6*b* in which the sound field control data of the sound field control section 3 with respect to a multi-channel source is stored. Therefore, the control section 8 can independently read or write a sound field control data for a 2-channel source, and that for a multi-channel source into the memory 6.

The display section 7 is displaying means for, on the basis of a display data Si supplied from the control section 8, displaying information relating to the selected audio source, a sound field setting state in the sound field control section 3, and the like. The control section 8 is configured so as to control the whole apparatus, and also to, based on content information Sd supplied from the DVD/CD reproduction section 1*c*, know the number of channels of the audio signal and perform a control corresponding to the number of channels. When a DVD on which a 5.1-channel audio signal is recorded is subjected to a reproducing process, the control section 8 knows from the content information Sd that the selected audio source is a 5.1-channel source, and is switched over from a control for the 2-channel system to that for the 5.1-channel system.

Next, the method of adjusting localization of the audio source which is performed in the sound field control section 3 will be described for each of the speakers. The localization adjustment corresponds to adjustment of the balance of volumes at the listening position respectively output from the speakers, and hence will be described as a method of adjusting the volume for each speaker.

First, a method of adjusting the volumes of the front left and right speakers and the rear front left and right speakers which constitute main channels will be described with reference to FIGS. 4 and 5. The volume adjustment for the main channels is performed by combination of adjustment of the volume balance in the lateral direction by the balance adjustment section 3*aa* and that of the volume balance in the anteroposterior direction by the fader adjustment section 3*ab*.

When an adjustment mode button which is not shown is depressed by the listener, the audio apparatus 10 is set to an adjustment mode in which balance/fader adjustment can be performed. As a result, the listener is enabled to adjust the balance/fader by using the balance/fader adjusting button 5*a* which is formed into a cross shape as shown in FIG. 3, and the display section 7. In the balance/fader adjusting button 5*a*, "Front" and "Rear" buttons which are vertically arranged correspond to fader adjusting means, and "Left" and "Right" buttons which are laterally arranged correspond to balance adjusting means. When the adjustment mode is set, as shown in FIG. 4, the display section 7 is configured as a display screen 7a which is partitioned in a lattice like manner by 20 steps in the vertical direction and 20 steps in the lateral direction. The current localization position of the main channels is indicated by a luminescent point 7b. One step on the display screen 7a corresponds to one operation conducted on the balance/fader adjusting button 5a. The luminescent point 7b is moved in the direction of the operated button by a distance corresponding to the number of operations. In a state where balance/fader adjustment has not yet been performed, the luminescent point 7b is located at the center position where thick lines intersect with each other.

Next, a specific operation in the case where the balance/fader adjusting button 5a is operated by the listener will be described. When, in a state where balance/fader adjustment has not yet been performed, "Right" button is depressed six times and "Front" button is depressed by two times by the listener, the balance/fader adjusting button 5a supplies a signal corresponding to the operation, as the operation data So to the control section 8. Based on the received operation data So, the control section 8 produces the sound field control data Sv to instruct the sound field control section 3 to perform a sound field control. Furthermore, the control section 8 produces the display data Si on the basis of the received operation data So to move the luminescent point 7b as shown in FIG. 4 in accordance with the operation performed on the balance/fader adjusting button 5a.

When balance/fader adjustment is performed by means of the balance/fader adjusting button 5a, the audio apparatus 10 switches over the input range of the balance/fader adjustment value in accordance with the number of channels of the audio source. Specifically, the control section 8 is configured so as to judge from the content information Sd whether the audio signal to be subjected to the sound field control is a 2-channel source or a 5.1-channel source, and to, on the basis of the result of the judgment, vary the input range of the balance/fader.

FIGS. 5A to 5C are principle diagrams illustrating the adjustable range of the fader by the audio apparatus 10. FIG. 5A shows the maximum adjustable range which can be physically adjusted by the fader adjustment section 3ab, FIG. 5B shows the fader adjustable range in the case of a 2-channel source, and FIG. 5C shows the fader adjustable range in the case of a 5.1-channel source. Although the description is omitted, it is assumed that a similar control is performed also on the balance adjustment section 3aa.

As shown in FIG. 5A, the fader adjustment section 3ab has the maximum adjustable range in which the maximum allowable attenuation in the front side is infinite (−∞) and that in the rear side is infinite (−∞). When fader adjustment of a 2-channel source is to be performed, the control section 8 sets the maximum adjustable range as the fader adjustable range as shown in FIG. 5B, so that infinite attenuation in the forward or rearward direction can be applied in the same manner as conventional fader adjustment of a 2-channel source.

By contrast, when fader adjustment of a 5.1-channel source is to be performed, the control section 8 narrows the adjustable range to a range from −10 dB in the front side to −10 dB in the rear side or reduces the variable attenuation amount, so that the adjustment in the vicinity of 0 dB can be finely performed. This switching of the adjustable range is conducted in view of the fact that the audio signal is produced on the premise that, in a 5.1-channel source, the reproduction volumes of the channels are equal to one another at the listening position. Namely, the adjustable range of a 5.1-channel source is not required to be widened to a range where the volume difference among the channels is extremely large. From the viewpoint of the listener, a wider adjustable range causes the attenuation amount per step to be increased, with the result that fader adjustment is roughly performed. By contrast, in the case of a narrow adjustable range, the attenuation amount per step can be set to be small, and hence fine fader adjustment can be performed so that the volume difference in the anteroposterior direction is constant.

FIG. 5B shows the case of a 2-channel source in which one step corresponds to −10 dB so that the attenuation amount at the tenth step is −∞, and (C) shows the case of a multi-channel source in which attenuation of −1 dB is attained by one step so that the attenuation amount at the tenth step is −10 dB. According to the configuration, in the case of a 2-channel source, the listener can select desired localization from the wide adjustable range, and, in the case of a 5.1-channel source, can select optimum localization from the narrow adjustable range in an easier manner.

Next, volume adjustment of the center speaker FC will be described.

The apparatus is configured so as to automatically calculate the value of volume adjustment of the center speaker FC from a balance/fader adjustment value. As shown in FIG. 2, the center speaker FC is basically placed between the front left and right speakers. Therefore, the volume adjustment value can be virtually calculated by using the balance/fader adjustment value of the front left and right speakers. Since the center speaker FC is placed in the front side in the same manner as the front left and right speakers, at least an attenuation value which is equivalent to the fader adjustment value of the front left and right speakers is necessary. Since the center speaker FC is placed between the front left and right speakers, the attenuation value between the balance adjustment value of the front left speaker and that of the front right speaker is required in accordance with the placement position of the center speaker. A specific calculation method will be described with reference to FIG. 4.

First, the center-channel sound field control section 3b reads from the sound field control data Sv the balance/fader adjustment value of the front left and right speakers, and then obtains the attenuation amount of each of the front left and right speakers. Specifically, when the center-channel sound field control section 3b reads from the balance/fader adjustment value that the right side is attenuated by −6 dB and the front side is attenuated by −2 dB, the control section obtains that the attenuation amount of the front left speaker is −2 dB and that of the front right speaker is −8 dB. Since the center speaker FC is placed at the median point of the front left and right speakers, the center-channel sound field control section 3b allocates the median value of the attenuation amount of the front left speaker and that of the front right speaker, as the volume of the center speaker FC. Namely, the center-channel sound field control section 3b allocates −5 dB which is the median value of −8 dB and −2 dB, as the volume of the center speaker.

In the audio apparatus 10, the center-channel sound field control section 3b performs the control in which the median value of the attenuation amounts of the front left and right speakers is allocated as the volume adjustment value of the center speaker. In the case where the center speaker FC is not placed at the median point of the front left and right speakers, the control may be performed in a different manner. Namely, the center-channel sound field control section 3b may be configured so that, in the case where the center speaker FC is placed with being deviated from the median point of the front left and right speakers, the attenuation amount is corrected in accordance with the degree of the deviation from the median point. When the center speaker FC is placed at a position where the gap between the front left and right speakers is divided at a ratio of 1:2, for example, the center-channel sound field control section 3*b* may set an attenuation amount which is obtained by dividing the relative attenuation amount of the front left and right speakers at the ratio of 1:2, as the attenuation amount of the center speaker. The control section 8 may recognize the positional relationship between the front left and right speakers and the center speaker FC, from a preset value, or alternatively on the basis of information which is input by the listener.

The volume level of the woofer SW is independently adjusted by an adjusting button which is separately disposed, and which is not shown.

Figure 6:
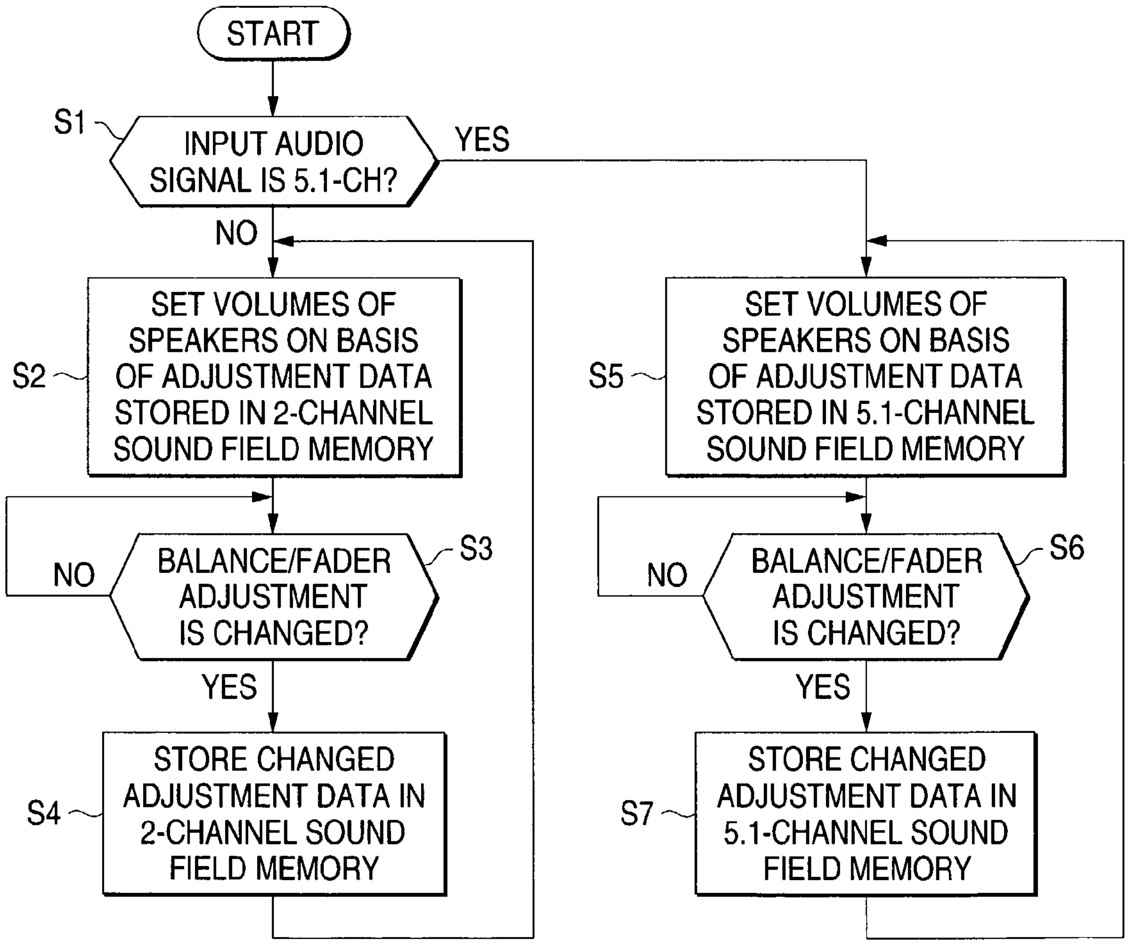
[FIG. 6]

Next, the whole operation of the sound field control by the audio apparatus 10 will be described with reference to the operation flow shown in FIG. 6. FIG. 6 shows an operation program which is previously recorded in a ROM (not shown), and which is automatically executed in response to designation of a source by the listener, for example, selection of the DVD/CD reproduction section 1*c*.

When one of the audio sources is selected by the listener through the source designation section 4, the control section 8 of the audio apparatus 10 is transferred to step S1. In step S1, the control section 8 judges whether the selected audio source is a 5.1-channel audio source or not. In the case where the DVD/CD reproduction section 1*c* is selected and it is judged from the content information Sd supplied from the DVD/CD reproduction section 1*c* that the selected audio source is a 5.1-channel audio source, the control section 8 is transferred to step S5 in order to perform a control for a 5.1-channel audio source. In another case, it is judged that a 2-channel audio source is selected, and the process is transferred to step S2 in order to perform a control for a 2-channel audio source.

When the process is transferred to step S2, the control section 8 accesses the memory 6 to obtain the balance/fader adjustment value for a 2-channel source from the 2-channel data storage area 6*a*, and then performs a sound field control on the speakers. Namely, on the basis of the obtained balance/fader adjustment value for a 2-channel source, the control section 8 produces the sound field control data Sv to instruct the sound field control section 3 to perform a sound field control, and is then transferred to step S3. Based on the obtained sound field control data Sv, the sound field control section 3 adjusts the balance/fader, thereby completing the adjustment of localization of the main channels.

In step S3, the control section 8 judges whether balance/fader adjustment is newly performed by the listener or not. Specifically, the control section 8 judges whether the above-mentioned adjustment mode button which is not shown is depressed or not. If not depressed, it is judged that the listener does not wish to perform readjustment, and the process returns to step S3 to continuously monitor whether the adjustment mode button is depressed or not. By contrast, if the adjustment mode button is depressed, the control section 8 judges that the listener wishes to perform readjustment, and the process is transferred to step S4.

In step S4, the control section 8 implements the above-mentioned 2-channel source balance/fader adjustment. In the audio apparatus 10, specifically, the display section 7 is switched to the display screen shown in FIG. 4, and the state where the main-channel balance/fader adjustment by the balance/fader adjusting button 5*a* is enabled is set. When a new adjustment value is input, the control section 8 produces the sound field control data Sv on the basis of the new adjustment value to instruct the sound field control section 3 to perform balance/fader adjustment based on the new adjustment value. The control section 8 produces the display data Si on the basis of the new adjustment value to move the luminescent point 7*b* on the display screen in accordance with the new adjustment value. When the adjustment mode button is again depressed by the listener, the control section 8 judges that the readjustment is ended, terminates the balance/fader adjustment mode, and updatedly stores the new adjustment value into the 2-channel data storage area 6*a* of the memory 6. Thereafter, the process is transferred to step S2.

In step S5, the control section 8 accesses the memory 6 to obtain the balance/fader adjustment value for a 5.1-channel source and the woofer volume adjustment value from the 5.1-channel data storage area 6*b*, and instructs the sound field control section 3 to set the volumes of the speakers. Specifically, on the basis of the obtained balance/fader adjustment value, the main-channel sound field control section 3*a* performs the balance/fader adjustment and the volume adjustment on the main channels. The center-channel sound field control section 3*b* obtains the volume adjustment value of the center speaker FC on the basis of the obtained balance/fader adjustment value, and adjusts the volume of the center speaker FC. The bass-channel sound field control section 3*c* adjusts the volume of the woofer SW on the basis of the obtained woofer volume adjustment value. After settings of the volumes of the speakers by the sound field control section 3 are completed, the control section 8 is transferred to step S6.

In step S6, the control section 8 judges whether balance/fader adjustment is newly performed by the listener or not. Specifically, the control section 8 judges whether the above-mentioned adjustment mode button which is not shown is depressed or not. If not depressed, it is judged that the listener does not wish to perform readjustment, and the process returns to step S6 to continuously monitor whether the adjustment mode button is depressed or not. By contrast, if the adjustment mode button is depressed, the control section 8 judges that the listener wishes to perform readjustment, and the process is transferred to step S7.

In step S7, the control section 8 implements a 5.1-channel source sound field adjustment program by the listener. In the audio apparatus 10, specifically, the display section 7 is switched to the display screen shown in FIG. 4, and the state where the main-channel balance/fader adjustment by the balance/fader adjusting button 5*a* is enabled is set. Furthermore, the audio apparatus 10 is set to the state where volume adjustment of the woofer SW by the input button for adjusting the volume is enabled. When a new adjustment value is input, the control section 8 produces the sound field control data Sv on the basis of the new adjustment value to instruct the sound field control section 3 to perform a sound field control based on the new adjustment value. When a new balance/fader adjustment value is input, for example, the control section 8 performs the volume adjustment of the main channels and that of the center speaker FC by means of balance/fader adjustment. By contrast, when a new volume adjustment value of the woofer SW is input, the control section 8 adjusts only the volume of the woofer on the basis of the new adjustment value.

The control section 8 produces the display data Si on the basis of the new adjustment value to change the display contents to a display screen corresponding to the new adjustment value by, for example, moving the luminescent point 7*b* on the display screen. When the adjustment mode button is again depressed by the listener, the control section 8 judges that the readjustment is ended, terminates the adjustment mode, and updatedly stores the new adjustment value into the 5.1-channel data storage area 6*b*. Thereafter, the process is transferred to step S5.

When the audio apparatus 10 is set to the adjustment mode, the speakers sequentially output an adjustment signal (such as pink noise), thereby allowing the listener to perform adjustment so that the volumes of the speakers are equal to one another at the listening position.

As described above, the audio apparatus 10 of the invention is previously provided with the memories for storing 2-channel sound field control data, and for storing multichannel sound field control data which are independent from each other. Therefore, it is not required to reset the sound field setting in accordance with the audio channels to be reproduced. According to the audio apparatus 10 of the invention, in both the cases of a 2-channel source and a multi-channel source, the listener can perform balance/fader adjustment by using the inputting means and the display screen which are shared in both the cases. Therefore, the operation of balance/fader adjustment can be simplified. Depending on the kind of the source, or the case of a 2-channel source or that of a multi-channel source, moreover, the adjustable range of balance/fader is switched over. Consequently, the apparatus is configured so that the listener can easily adjust the sound field so as to be suitable to the contents. In the audio apparatus 10 of the invention, since the volume of the center speaker is adjusted on the basis of the balance/fader adjustment value, it is not necessary to additionally dispose means for inputting the volume adjustment value of the center speaker, and the process of setting the sound field in the case of a multi-channel source can be simplified.

In the above, the audio apparatus 10 of the embodiment has been described in which data relating to volume setting values of the speakers which define sound localization are stored in the memory 6 for each of the numbers of channels of audio sources. Alternatively, an adjustment value of a graphic equalizer may be stored in the memory 6 for each of the numbers of channels of audio sources. According to the configuration, when a 2-channel source is selected, the tone is automatically set to a favorite one, and, when a 5.1-channel source is selected, the apparatus is automatically set so that the tones of the speakers are equal to one another.

In the above, the audio apparatus 10 of the embodiment in which an audio signal of the 2-channel system and that of the 5.1-channel system are used has been described. The kinds of the audio signals are requested to those of the 2-channel system and a multi-channel system, and the multi-channel system is not restricted to the 5.1-channel system. The example in which a 5.1-channel audio signal is supplied from the DVD/CD reproduction section 1*c* has been described. Alternatively, an audio signal may be supplied from another audio source such as the tuner receiver section 1*b*. In the above, the audio apparatus 10 has been described in which the 2-channel system or the 5.1-channel system is detected from the content information supplied from the DVD/CD reproduction section 1*c* when a multichannel compatible DVD disk is to be subjected to a reproducing process. The manner of the detection is not restricted to this. The detection may be performed by counting the number of channels. The audio apparatus 10 described above is a vehicle audio apparatus. The kind of the apparatus is not restricted to this.

According to the invention, sound field control data are stored for each of the numbers of channels of audio sources. Even when the number of channels of the audio source to be reproduced is changed to another one, therefore, it is not required to again set the sound field control data. Since the input range of sound field control data is variable in accordance with the number of channels of the audio source to be controlled, a sound field suitable to the number of channels can be easily set.

What is claimed is:

1. An audio apparatus to which plural kinds of audio signals of different numbers of channels are input, comprising:

an input section to which an adjustment value for controlling a sound field is input;

a sound field control section which performs a sound field control on the audio signals on the basis of the adjustment value;

a storage section which stores the adjustment value;

a detection section which detects the kinds of the audio signals; and a control section which, on the basis of a result of the detection, stores the adjustment value in said storage section for each of the kinds of audio signals;

wherein the adjustment value is determined based on at least a user listening position, wherein said sound field control section includes at least one of a balance adjustment section which adjusts a balance of the audio signals, and a fader adjustment section which adjusts a fader of the audio signals, and in accordance with the result of the detection by said detection section, said control section changes an input range of the adjustment value in said input section and relating to at least one of said balance adjustment section and said fader adjustment section.

2. An audio apparatus to which plural kinds of audio signals of different numbers of channels are input, comprising:

an input section to which an adjustment value for controlling a sound field is input;

a sound field control section which performs a sound field control on the audio signals on the basis of the adjustment value;

a storage section which stores the adjustment value;

a detection section which detects the kinds of the audio signals; and a control section which, on the basis of a result of the detection, stores the adjustment value in said storage section for each of the kinds of audio signals;

wherein said sound field control section includes a center-channel sound field control section, said center-channel sound field control section is configured so that, in a case where a center speaker is placed with being deviated from a median point of front left and right speakers, an attenuation amount is corrected in accordance with a degree of a deviation from the median point.

3. The audio apparatus according to claim 2, wherein said control section recognizes a positional relationship between said front left and right speakers and said center speaker, from a preset value.

4. The audio apparatus according to claim 2, wherein said control section recognizes a positional relationship between said front left and right speakers and said center speaker, on the basis of information input by a listener.

* * * * *